United States Patent [19]
Fulks et al.

[11] Patent Number: 5,621,556
[45] Date of Patent: Apr. 15, 1997

[54] METHOD OF MANUFACTURING ACTIVE MATRIX LCD USING FIVE MASKS

[75] Inventors: Ronald T. Fulks, Mountain View; William Yao, Los Altos; Chuang C. Tsai, San Jose, all of Calif.

[73] Assignee: Xerox Corporation, Stamford, Conn.

[21] Appl. No.: 453,732

[22] Filed: May 30, 1995

Related U.S. Application Data

[63] Continuation-in-part of Ser. No. 235,009, Apr. 28, 1994.

[51] Int. Cl.[6] .......................... G02F 1/136; H01L 21/265
[52] U.S. Cl. .............................. 349/42; 438/701; 438/30; 349/43
[58] Field of Search .......................... 359/59, 58, 57, 359/87; 257/59; 437/40, 41, 51

[56] References Cited

U.S. PATENT DOCUMENTS

| | | | |
|---|---|---|---|
| 4,717,631 | 1/1988 | Kahanowicz et al. | 148/33.3 |
| 5,182,661 | 1/1993 | Ikeda et al. | 359/54 |
| 5,185,601 | 2/1993 | Takeda et al. | 340/784 |
| 5,208,690 | 5/1993 | Hayashi et al. | 359/59 |
| 5,316,956 | 5/1994 | Iwasaki et al. | 437/5 |
| 5,334,860 | 8/1994 | Naito | 257/59 |
| 5,468,987 | 11/1995 | Yamazaki et al. | 257/412 |
| 5,478,766 | 12/1995 | Park et al. | 437/40 |
| 5,496,752 | 3/1996 | Nasu et al. | 437/41 |

FOREIGN PATENT DOCUMENTS

| | | |
|---|---|---|
| 0450941 | 10/1991 | European Pat. Off. . |
| 4-265945 | 9/1992 | Japan . |

*Primary Examiner*—Anita Pellman Gross
*Assistant Examiner*—Toan Ton
*Attorney, Agent, or Firm*—Oliff & Berridge

[57] ABSTRACT

The invention provides a method for manufacturing an active matrix liquid crystal displaying device having a plurality of thin film transistors using five masks. A plurality of gate electrodes are formed using a first mask. A plurality of etch stoppers are formed over the gate electrodes using a second mask. A plurality of chain electrodes and a plurality of source electrodes are formed using a third mask. A passivation layer including via holes is formed using a fourth mask. A plurality of pixel electrodes are formed using a fifth mask.

13 Claims, 4 Drawing Sheets

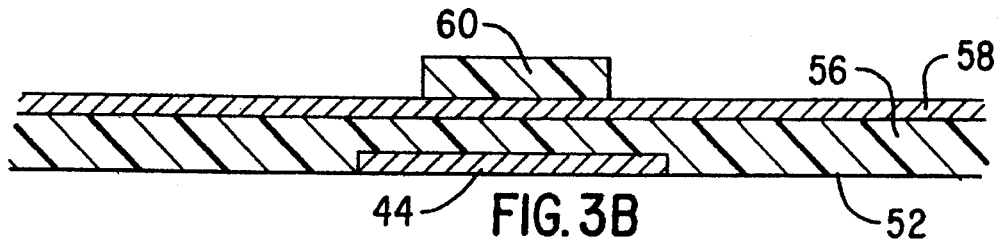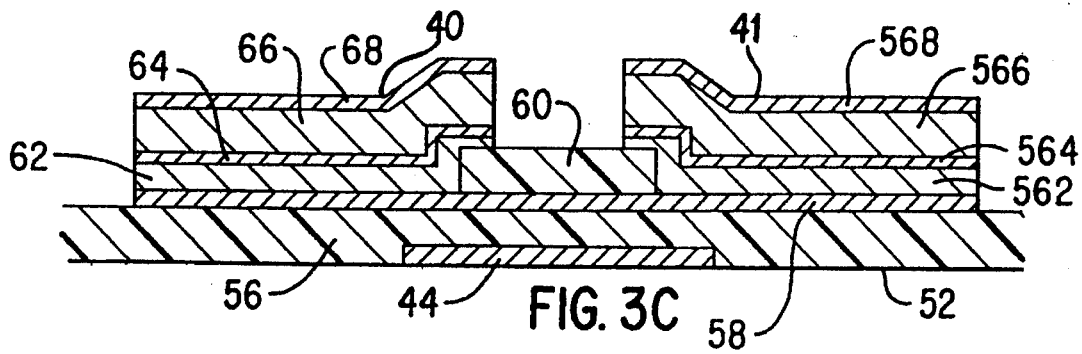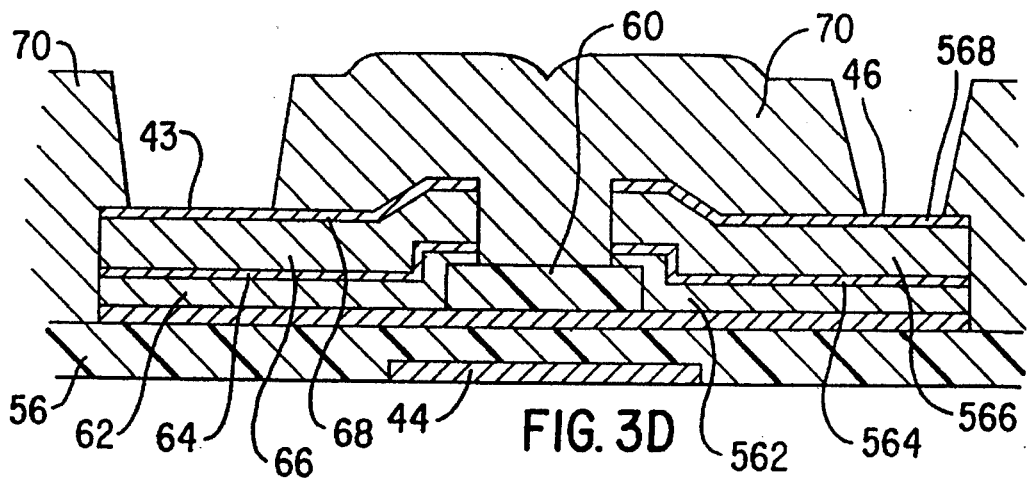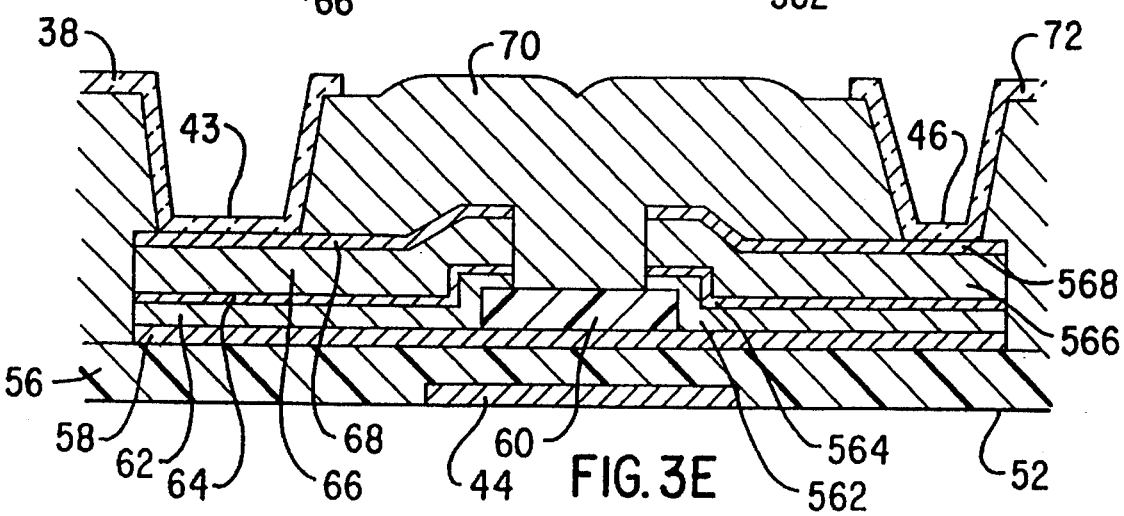

METHOD OF MANUFACTURING ACTIVE MATRIX LCD USING FIVE MASKS

RELATED APPLICATIONS

This application is a continuation-in-part application of parent application Ser. No. 08/235,009 filed on Apr. 28, 1994.

BACKGROUND OF THE INVENTION

1. Field of the Invention

The invention generally relates to an active matrix liquid crystal device and manufacturing method using a five mask display architecture.

2. Description of Related Art

Active matrix liquid crystal devices (AMLCD) improve display quality by using thin film transistors (TFT) to drive pixel electrodes. The AMLCD is used in display portions of many high volume products such as laptops. Thus, there is great interest to improve manufacturing yields by simplifying the manufacturing processes leading to increased product reliability and reduction in product cost.

The pixel electrode in AMLCD designs usually comprises a layer of indium-tin-oxide (ITO) because the ITO is both transparent and conductive. Current AMLCD designs form a passivation layer over the ITO layer. The liquid crystal material is placed over the passivation layer and a common electrode is formed over the liquid crystal material completing the AMLCD device.

Since AMLCDs are commonly used in portable devices which have limited battery lifetimes, a new AMLCD structure is designed to reduce power consumption of the AMLCD. This structure is described in detail in the parent application Ser. No. 08/235,009. The new structure places the ITO layer above the passivation layer so that the voltage necessary to drive the pixel electrode is reduced, thus reducing the power consumption of the AMLCD.

A process for manufacturing the new AMLCD structure is more efficient than earlier methods. However, since the ITO layer is above the passivation layer, a source electrode to gate electrode connection requires etching a via hole through multiple layers of different materials. This etching process requires steps additional to that required to form the TFTs and pixel electrodes. These additional steps can be eliminated without affecting the processes required to form the TFT's and pixel electrodes. If these additional steps are eliminated, the cost of AMLCD will be reduced.

SUMMARY OF THE INVENTION

An object of the invention is to provide a method for manufacturing an active matrix liquid crystal device having a plurality of thin film transistors (TFT) using five masks. A plurality of gate electrodes of the TFTs are formed over a substrate using a first mask. A plurality of etch stoppers are formed over the plurality of gate electrodes using a second mask. Each of the etch stoppers corresponds to one gate electrode. A plurality of drain electrodes and a plurality of source electrodes are formed using a third mask. A passivation layer is formed including via holes using a fourth mask. Finally, a plurality of pixel electrodes are formed over the passivation layer using a fifth mask.

Another object of the invention is to provide a via hole through the passivation layer and the gate insulating layer so that a distance between a sidewall of the via hole through the passivation layer from a center of the via hole is at least a distance between a sidewall of the via hole through the gate insulating layer and the via hole center.

BRIEF DESCRIPTION OF THE DRAWINGS

The invention will be described in detail with reference to the following drawings, wherein:

FIG. 3A–3E are cross-sectional views of a thin film transistor formed by the invention using five masks;

DETAILED DESCRIPTION OF PREFERRED EMBODIMENTS

Figure 1:
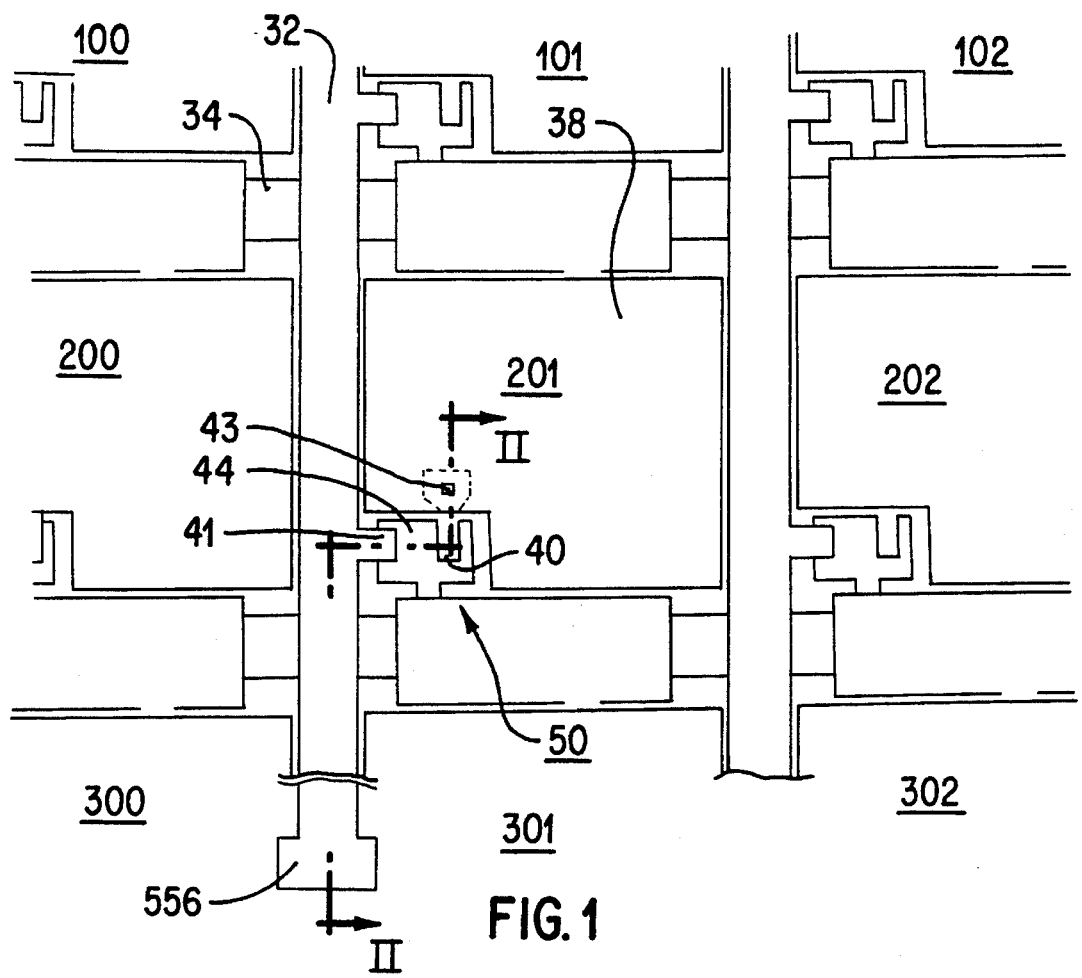
FIG. 1 is a top plan view of pixel regions of an active matrix liquid crystal display device.

FIG. 1 shows an AMLCD substrate surface divided into pixel regions 100–102, 200–202 and 300–302 by the gate lines 34 and data lines 32. Each pixel region comprises a pixel electrode 38 and a TFT 50. Each TFT 50 comprises a gate electrode 44, a drain electrode 40 and a source electrode 41. The drain electrode 40 of the TFT 50 is connected to the pixel electrode 38 at via hole 43. The source electrode 41 is connected to the data line 32.

Figure 2:
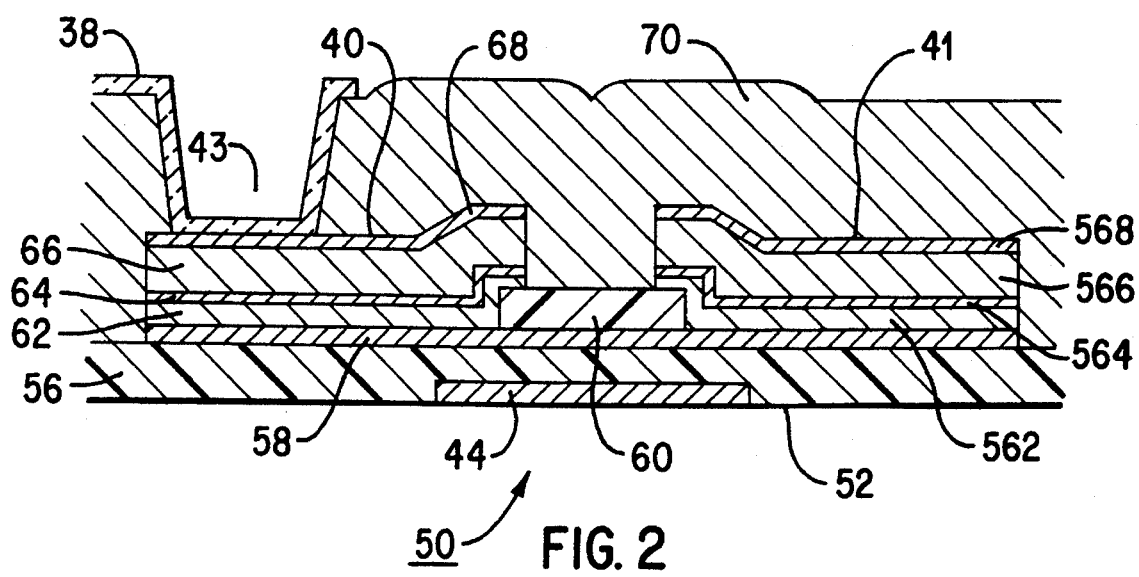
FIG. 2 is a cross-sectional view along the section line II—II of FIG. 1.

FIG. 2 shows the cross-section of the TFT 50 including the via hole 43 along sectional line II—II. The gate electrode 44 is formed over the substrate 52. The gate insulation layer 56 is formed over the gate electrode 44 and an active amorphous silicon (a-Si) layer 58 is formed over the gate electrode 44 above the gate insulation layer 56. The gate insulation layer 56 comprises materials including but not limited to silicon nitride (SIN), silicon oxynitride (SiON), composite layers of SiN and SiON and anodic oxides such as tantalum oxide and aluminum oxide. An etch stopper 60 is formed above the gate electrode 44 over the a-Si layer 58.

The drain electrode of the TFT 50 comprises an n+ doped silicon layer 62 and a metal layer formed over the a-Si layer 58 and partially over the etch stopper 60. For this embodiment the metal layer comprises a titaniumtungsten (TiW) barrier layer 64, an aluminum layer 66 and another TiW layer 68. The metal layers 64, 66 and 68 form a metal contact for the drain electrode 40. The source electrode 41 of the TFT 50 is formed similarly to the drain electrode 40 but is separated from the drain electrode 40 above the etch stopper 60.

A passivation layer 70 is formed over the TFT 50. The via hole 43 is formed in the passivation layer 70 to expose the drain electrode 40. The pixel electrode 38 is formed over the passivation layer 70 and makes contact with the drain electrode 40 through the via hole 43.

A display data signal from an external source (not shown) is input to the TFT 50 through the source electrode 41. The pixel electrode 38 does not receive the display data signal unless the TFT 50 is ON. When an appropriate electrical potential is applied to the gate 44, the TFT 50 turns ON. When the TFT is ON, the a-Si layer 58 above the gate 44 becomes conductive and connects the source electrode 41 with the drain electrode 40. Thus, when the TFT 50 is ON, the display data signal is connected to the pixel electrode 38. The pixel electrode 38, in conjunction with the common electrode (not shown), switches the LCD pixel element ON and OFF based on the content of the display data signal.

FIGS. 3A–3E show a method for manufacturing the TFT 50. In FIG. 3A, a metal layer of about 1500 Å thick is formed over the substrate 52. The metal layer may be formed using a class of refractory metals or metal layers such as chromium, molybdenum or titanium. Copper, aluminum or aluminum capped with titanium as a barrier metal can also be used. The metal layer is etched using a first mask to form the gate lines 32 and the gate electrode 44.

In FIG. 3B, the gate insulating layer 56 is formed over the substrate 52 and the gate electrode 44. For this embodiment, the gate insulating layer 56 is a nitride layer such as silicon nitride (SIN) deposited at a temperature range of about 300°–380° C. having a thickness of about 3000 Å. An a-Si layer 58 is formed over the gate insulating layer 56. The a-Si layer 58 contains about 5–12% hydrogen and is formed at a temperature range of about 230°–300° C. to a thickness of between about 300–500 Å. An etch stopper layer is formed over the a-Si layer 58. The etch stopper layer is formed at a temperature range of about 200°–250° C. to a thickness of between about 10001–500 Å. A second mask is used to pattern the etch stopper layer to form the etch stopper 60.

In FIG. 3C, the drain electrode 40 and the source electrode 41 are formed. The drain and source electrodes 40 and 41, respectively, includes the n+ silicon layers 62 and 562 formed over the a-Si layer 58 and the etch stopper 60. The n+ silicon contains about 0.5–2% phosphorous and about 5–15% hydrogen and is deposited at between about 200°–250° C. to a thickness of about 1000 Å. Metal layers are formed over the n+ silicon layers 62 and 562. The metal layer may be metals such as molybdenum-chromium, titanium, tantalum, a multilayered structure of alternating layers of aluminum and titanium-tungsten or aluminum with a dual dielectric capping layer. For this embodiment, the metal layers are a multilayered structure each having a first TiW layer 64 and 564 of about 500 Å as barrier metal, an aluminum layer 66 and 566 of between about 3000–4000 Å and another TiW layer 68 and 568 of between about 500–1000 Å thick. The metal layers and the n+ silicon layers 62 and 562 are patterned by a third mask and etched to form the drain electrode 40 and the source electrode 41.

A multiple-step etch is used to etch the metal layers and the n+ silicon layers 62 and 562. First, hydrogen peroxide (H$_2$O$_2$) is used to etch the TiW layers 68 and 568. This etch is followed by a standard aluminum etching step which in turn is followed by a second H$_2$O$_2$ etch step to etch the bottom TiW layers 64 and 564. The n+ silicon layers 62 and 562 are etched by using a 10:1 CF$_4$/O$_2$. The combination of these etching steps forms the drain and source electrodes 40 and 41, respectively. The metal layers and the n+ silicon layers 62 and 562 above the etch stopper 60 are etched leaving a small portion of the drain and source electrodes 40 and 41, respectively over the edge of the etch stopper 60.

In FIG. 3D, the passivation layer 70 is formed over the a-Si layer 58 and the drain and source electrodes 40 and 41, respectively. For this embodiment, the passivation layer 70 comprises silicon oxynitride (Sic)N) of about 6000 Å thick. Other materials such as SiN or polyimide may also be used for the passivation layer 70. The passivation layer 70 is patterned by a fourth mask and etched to form the drain via hole 43.

In FIG. 3E, the pixel electrode 72 is formed by forming a conductive and transparent layer, ITO for this embodiment, over the passivation layer 70 and over the via hole 43 to make contact with the drain electrode 40. The ITO layer is etched with a fifth and final mask completing the TFT 50. Accordingly, the TFT 50 is formed using only 5 masks.

Figure 4:
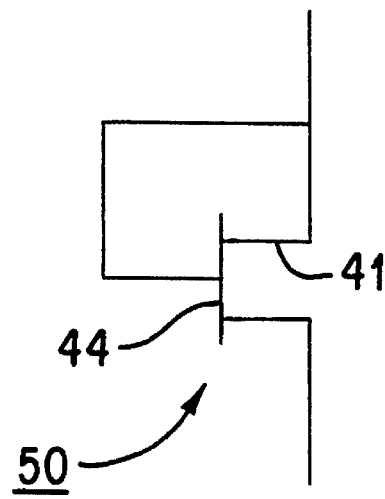
FIG. 4 shows a transistor configuration connecting the source electrode to the gate electrode.
Figure 5:
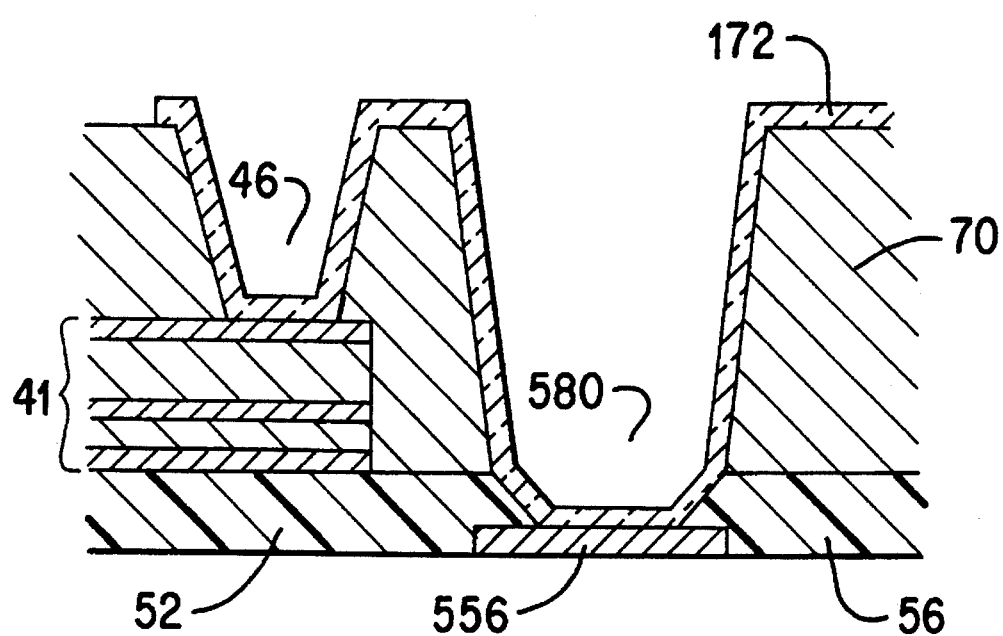
FIG. 5 shows a cross-section of a source to gate line connection.

While FIGS. 3A–3E illustrate the formation of the TFT 50, other circuit connections are also formed without additional masks. FIG. 4 shows a common TFT configuration that requires the source electrode 41 to be connected to the gate 44. FIG. 5 shows a cross-section of the source electrode 41 connected to a portion 556 of a gate line 34 which is connected to the gate 44.

Via holes 46 and 580 are formed when the passivation layer 70 is formed using the fourth mask. When the ITO layer 172 is formed, as shown in FIG. 5 contact is made with the source electrode 41 and the gate line portion 556 to form the TFT configuration of FIG. 4.

Figure 6:
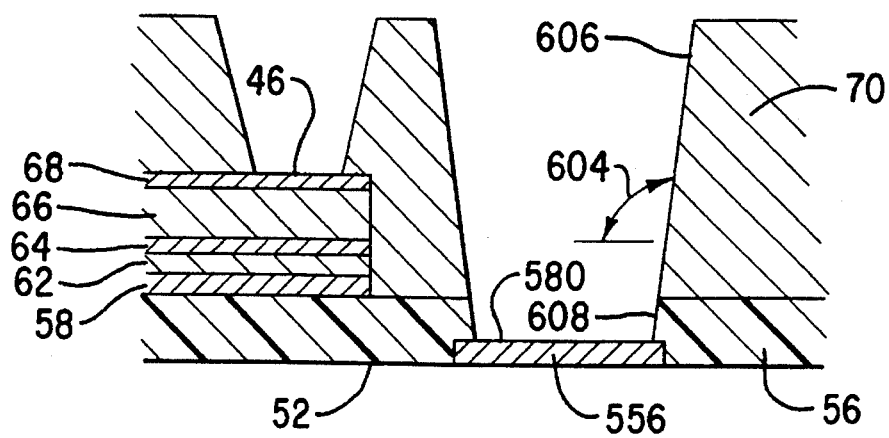
FIG. 6 is a cross-section of a via hole formed through the passivation layer and the gate insulating layer when the etching rate of the passivation layer is equal to the etching rate of the gate insulating layer.

FIG. 6 shows the ideal etching profile for the via hole 580. The passivation layer 70 and the gate insulating layer 56 is etched using a plasma taper-etch process. The plasma taper-etch is performed using about 40 SCCM of Sulfur Hexafluoride (SF$_6$), about 32 SCCM of oxygen (O$_2$) and about 8 SCCM of carbon tetrafluoride (CF$_4$).

The etching process etches through both the passivation layer 70 and the gate insulating layer 56 to reach the gate line portion 556. The sidewall of the via hole 580 comprises two sections 606 and 608. In FIG. 6, the sidewall sections 606 and 608 form an angle 604 with respect to a line parallel to the surface of the substrate 52. When the etching rate is identical for both the passivation layer 70 and the gate insulating layer 56, the sidewall section 606 and 608 form a smooth surface from the top of the passivation layer 70 all the way down to the surface of the gate line portion 556.

Figure 7:
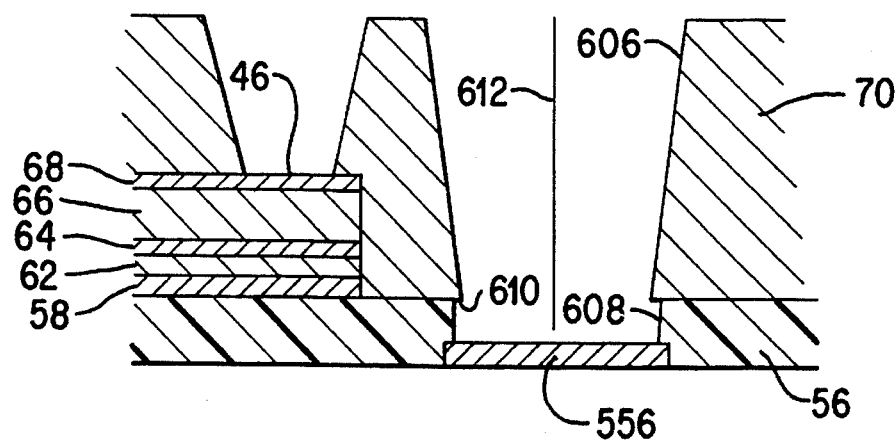
FIG. 7 is the cross-section of the via hole through the passivation layer and the gate insulating layer when the etching rate of the passivation layer is less than the etching rate of the gate insulating layer.

However, if the etching rate of the passivation layer 70 is slower than the etching rate of the gate insulating layer 56, then a step 610 forms at the interface between the passivation layer 70 and the gate insulating layer 56 as shown in FIG. 7. Since the sidewall section 608 is etched at a faster rate than the sidewall section 606, the sidewall section 608 forms a smaller angle 602 with respect to the substrate surface and is etched further along the horizontal direction than the sidewall section 606. Thus, the step 610 is formed by the passivation layer 70 immediately above the gate insulating layer 56. When the step 610 is formed, the ITO layer 172 as shown in FIG 5 forms a step coverage over the passivation layer 70, the gate insulating layer 56 and the gate line portion 556. A break in the ITO layer 172 step coverage can easily occur creating an open circuit between the ITO layer 172 and the gate line portion 556.

Figure 8:
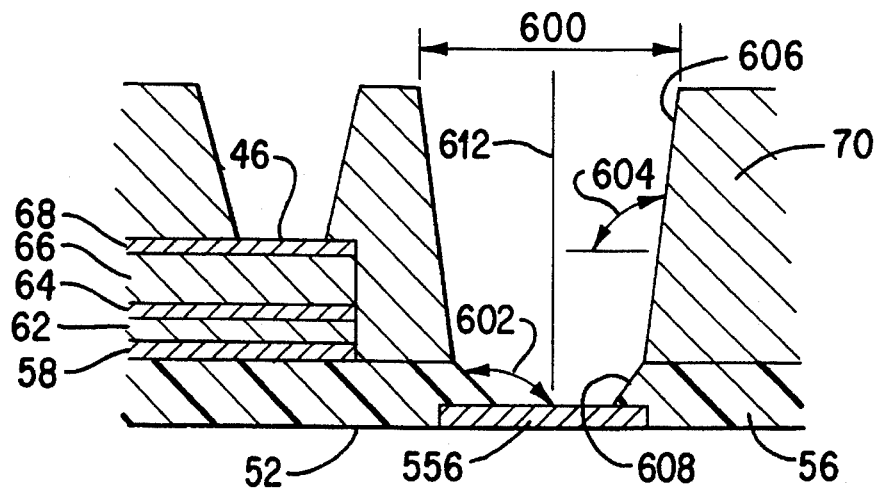
FIG. 8 is the cross-section of the via hole through the passivation layer and the gate insulating layer when the etching rate of the passivation layer is greater than the etching rate of the gate insulating layer.

In view of the problems that can occur when the step 610 is formed, the characteristics of the passivation layer 70 is adjusted so that the etching rate of the passivation layer 70 is greater than the etching rate of the gate insulating layer 56. FIG. 8 shows the via hole 580 cross-section when the etching rate of the passivation layer 70 is greater than the etching rate of the gate insulating layer 56. The angle 604 formed by the sidewall 606 of the passivation layer 70 with respect to the line parallel to the surface of the substrate is less than the angle 602 formed by the sidewall 608 of the gate insulating layer 56. The distance between the sidewall 602 and a via hole center 612 of the passivation layer 70 is greater than or equal to the distance between the sidewall 608 and the via hole center 612.

When the via hole 580 has a cross-section as shown in FIG. 8, the ITO layer 172 adheres to the total surface of the via hole 580 as shown in FIG. 5. Accordingly, the etching rate of the passivation layer 70 is controlled to be greater than or equal to the etching rate of the gate insulating layer 56.

In the preferred embodiment, the passivation layer 70 and the gate insulation layer 56 is etched by the plasma taper-etch process which etches the passivation layer 70 faster than the gate insulating layer 56. Further, the etching rate of the passivation layer 70 is also increased by depositing the passivation layer 70 at a temperature of about 200° C.

A high quality passivation layer 70 is obtained when the passivation layer 70 is deposited at a high temperature. However, as the quality of the passivation layer 70 increases the corresponding etching rate decreases. Thus, to increase the etching rate of the passivation layer 70, the passivation layer deposition temperature must be decreased. Decreasing the passivation layer deposition temperature decreases the quality of the passivation layer 70. Therefore, the etching rate of the passivation layer 70 and the quality of the passivation layer 70 is balanced against each other to obtain an optimum temperature of about 200° C.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A method for manufacturing an active matrix liquid crystal device using five masks, comprising:
   forming a plurality of gate electrodes over a substrate using a first mask;
   forming a plurality of etch stoppers over the plurality of gate electrodes using a second mask, each etch stopper being formed over one gate electrode;
   forming a plurality of drain electrodes and a plurality of source electrodes using a third mask, a portion of each of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;
   forming over the substrate a passivation layer having at least one first via hole using a fourth mask; and
   forming a pixel electrode over the passivation layer using a fifth mask.

2. The method of claim 1, further comprising:
   forming a plurality of gate lines over the substrate using the first mask;
   forming a gate insulating layer over the substrate and the plurality of gate lines, wherein the passivation layer is formed over the plurality of drain electrodes, the plurality of source electrodes and the gate insulating layer; and
   etching at least one of the passivation layer and the gate insulating layer to form at least one second via hole, the first and second via holes exposing at least one of a portion of the plurality of drain electrodes, a portion of the plurality of source electrodes and a portion of the plurality of gate lines.

3. The method of claim 2, wherein an etching rate of the passivation layer is at least an etching rate of the gate insulating layer.

4. The method of claim 2, wherein the plurality of drain electrodes and the plurality of source electrodes are substantially unaffected by the etching step.

5. The method of claim 2, wherein the etching step applies a plasma taper-etch process having about 40 sccm of sulfur hexafluoride, about 32 sccm of oxygen and about 8 sccm of carbon tetrafluoride.

6. The method of claim 2, wherein the gate insulating layer is comprised of silicon nitride.

7. The method of claim 1, wherein the pixel electrode is comprised of indium-tin-oxide.

8. The method of claim 1, wherein the passivation layer is comprised of silicon oxynitride formed at a temperature of about 200° C.

9. An active matrix liquid crystal device, comprising:
   a plurality of gate electrodes formed over a substrate and a plurality of gate lines formed over the substrate using a first mask;
   a plurality of etch stoppers formed over the plurality of gate electrodes using a second mask, each gate stopper formed over one electrode;
   a gate insulating layer formed over the substrate and the plurality of gate lines;
   a plurality of drain electrodes and a plurality of source electrodes formed using a third mask, a portion of each of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;
   a passivation layer formed over the substrate, wherein the passivation layer is formed over the plurality of drain electrodes, the plurality of source electrodes and the gate insulating layer; and
   a plurality of via holes through at least one of the passivation layer and the gate insulating layer exposing at least one of a portion of the plurality of drain electrodes, a portion of the plurality of source electrodes and a portion of the plurality of gate lines.

10. The active liquid crystal device of claim 9, wherein a first portion of the plurality of via holes is formed through the passivation layer and a second portion of the via hole is formed through the gate insulating layer, a value of an angle formed by a sidewall of the second portion of the plurality of via holes and a surface of the substrate being at least a value of an angle formed by a sidewall of the first portion of the plurality of via holes and the surface of the substrate.

11. The active liquid crystal device of claim 10, wherein a distance between the sidewall of the first portion of the via hole and a via hole center is at least a distance between the sidewall of the second portion of the via hole and the via hole center.

12. The active matrix liquid crystal device of claim 9, wherein the gate insulating layer is comprised of silicon nitride.

13. The active matrix liquid crystal device of claim 9, wherein the passivation layer is comprised of silicon oxynitride formed at a temperature of about 200° C.

* * * * *

UNITED STATES PATENT AND TRADEMARK OFFICE
CERTIFICATE OF CORRECTION

| | | |
|---|---|---|
| PATENT NO. | : 5,621,556 | Page 1 of 1 |
| APPLICATION NO. | : 08/453732 | |
| DATED | : April 15, 1997 | |
| INVENTOR(S) | : Ronald T. Fulks, William Yao and Chuang C. Tsai | |

It is certified that error appears in the above-identified patent and that said Letters Patent is hereby corrected as shown below:

Column 6, line 25, in claim 9, the text "each gate stopper" should read --each etch stopper--.

Signed and Sealed this

Twenty-seventh Day of October, 2009

David J. Kappos
*Director of the United States Patent and Trademark Office*

(12) EX PARTE REEXAMINATION CERTIFICATE (9367th)
United States Patent
Fulks et al.

(10) Number: US 5,621,556 C1
(45) Certificate Issued: Oct. 15, 2012

(54) METHOD OF MANUFACTURING ACTIVE MATRIX LCD USING FIVE MASKS

(75) Inventors: Ronald T. Fulks, Mountain View, CA (US); William Yao, Los Altos, CA (US); Chuang C. Tsai, San Jose, CA (US)

(73) Assignee: Thomson Licensing, Boulogne-Billancourt (FR)

Reexamination Request:
No. 90/010,958, Apr. 22, 2010

Reexamination Certificate for:
Patent No.: 5,621,556
Issued: Apr. 15, 1997
Appl. No.: 08/453,732
Filed: May 30, 1995

Related U.S. Application Data

(63) Continuation-in-part of application No. 08/235,009, filed on Apr. 28, 1994, now abandoned.

(51) Int. Cl.
*H01L 21/265* (2006.01)
*G02F 1/136* (2006.01)

(52) U.S. Cl. .............. 349/42; 438/701; 438/30; 349/43
(58) Field of Classification Search .................. None
See application file for complete search history.

(56) References Cited

To view the complete listing of prior art documents cited during the proceeding for Reexamination Control Number 90/010,958, please refer to the USPTO's public Patent Application Information Retrieval (PAIR) system under the Display References tab.

*Primary Examiner* — Tuan H Nguyen

(57) ABSTRACT

The invention provides a method for manufacturing an active matrix liquid crystal displaying device having a plurality of thin film transistors using five masks. A plurality of gate electrodes are formed using a first mask. A plurality of etch stoppers are formed over the gate electrodes using a second mask. A plurality of chain electrodes and a plurality of source electrodes are formed using a third mask. A passivation layer including via holes is formed using a fourth mask. A plurality of pixel electrodes are formed using a fifth mask.

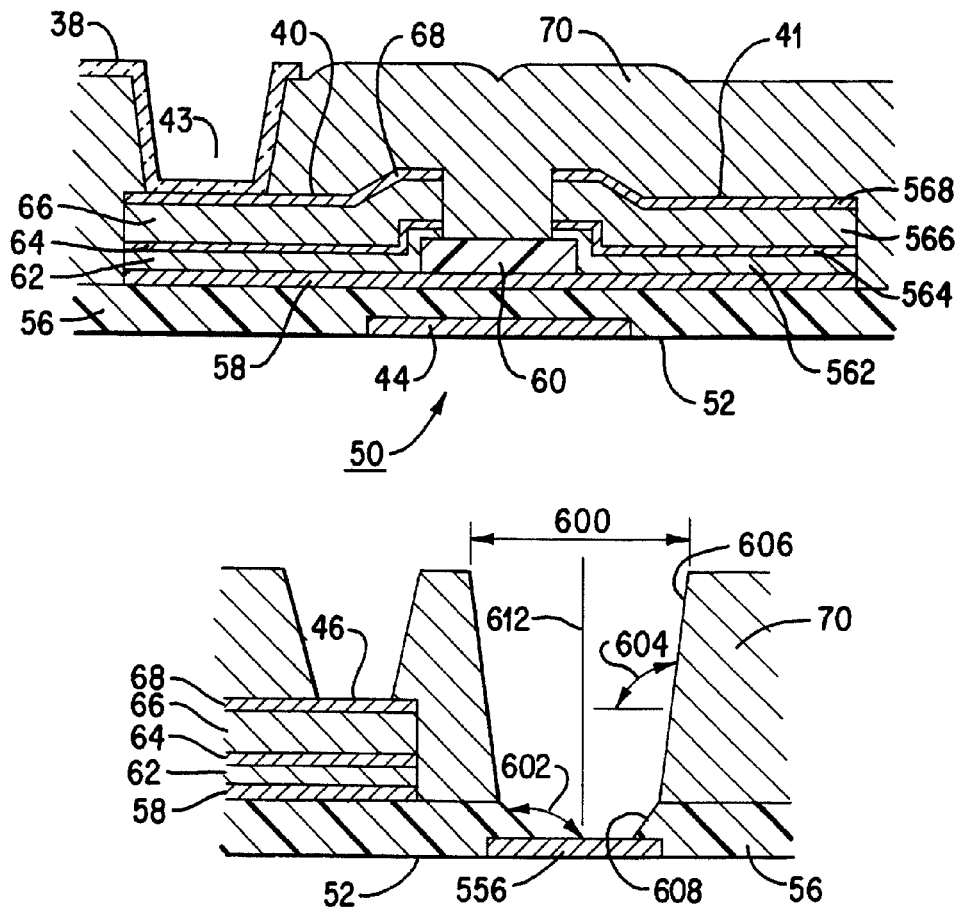

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-13 is confirmed.

New claims 14-17 are added and determined to be patentable.

*14. A five mask method for manufacturing an active matrix liquid crystal device, comprising:*

*forming a plurality of gate electrodes and gate lines over a substrate using a first mask;*

*forming a gate insulating layer over the substrate and the plurality of gate lines;*

*forming a plurality of etch stoppers over the plurality of gate electrodes using a second mask, each etch stopper being formed over one gate electrode;*

*forming a plurality of drain electrodes and a plurality of source electrodes using a third mask, a portion of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;*

*forming over the substrate a passivation layer having at least one first via hole using a fourth mask, wherein the passivation layer is formed over the plurality of drain electrodes, the plurality of source electrodes and the gate insulating layer;*

*etching at least one of the passivation layer and the gate insulating layer to form at least one second via hole, the first and second via holes exposing at least one of a portion of the plurality of drain electrodes, a portion of the plurality of source electrodes and a portion of the plurality of gate lines; and*

*forming a pixel electrode over the passivation layer using a fifth mask.*

*15. A five mask method for manufacturing an active matrix liquid crystal device, comprising:*

*forming a plurality of gate electrodes and gate lines over a substrate using a first mask;*

*forming a gate insulating layer over the substrate and the plurality of gate lines;*

*forming a plurality of etch stoppers over the plurality of gate electrodes using a second mask, each etch stopper being formed over one gate electrode;*

*forming a plurality of drain electrodes and a plurality of source electrodes using a third mask, a portion of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;*

*forming over the substrate a passivation layer having at least one first via hole using a fourth mask, wherein the passivation layer is formed over the plurality of drain electrodes, the plurality of source electrodes and the gate insulating layer;*

*etching at least one of the passivation layer and the gate insulating layer to form at least one second via hole, the first and second via holes exposing at least one of a portion of the plurality of drain electrodes, a portion of the plurality of source electrodes and a portion of the plurality of gate lines, wherein an etching rate of the passivation is at least an etching rate of the gate insulating layer; and*

*forming a pixel electrode over the passivation layer using a fifth mask.*

*16. A five mask method for manufacturing an active matrix liquid crystal device, consisting of:*

*forming a plurality of gate electrodes over a substrate using a first mask;*

*forming a plurality of etch stoppers over the plurality of gate electrodes using a second mask, each etch stopper being formed over one gate electrode;*

*forming a plurality of drain electrodes and a plurality of source electrodes using a third mask, a portion of each of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;*

*forming over the substrate a passivation layer having at least one first via hole using a fourth mask; and*

*forming a pixel electrode over the passivation layer using a fifth mask.*

*17. A five mask method for manufacturing a pixel electrode for an active matrix liquid crystal device, consisting of:*

*forming a plurality of gate electrodes over a substrate using a first mask;*

*forming a plurality of etch stoppers over the plurality of gate electrodes using a second mask, each etch stopper being formed over one gate electrode;*

*forming a plurality of drain electrodes and a plurality of source electrodes using a third mask, a portion of each of the drain electrodes being formed over a first portion of a corresponding one of the etch stoppers and a portion of each of the source electrodes being formed over a second portion of the corresponding one of the etch stoppers, wherein the source and the drain electrodes are separated over the corresponding one of the etch stoppers;*

*forming over the substrate a passivation layer having at least one first via hole using a fourth mask; and*

*forming a pixel electrode over the passivation layer using a fifth mask.*

\* \* \* \* \*